United States Patent
Yoo et al.

(10) Patent No.: US 8,716,929 B2
(45) Date of Patent: May 6, 2014

(54) ORGANIC ELECTROLUMINESCENT DEVICE

(75) Inventors: Juhn-Suk Yoo, Goyang-si (KR);
Yong-Chul Kim, Paju-si (KR)

(73) Assignee: LG Display Co., Ltd, Seoul (KR)

( * ) Notice: Subject to any disclaimer, the term of this patent is extended or adjusted under 35 U.S.C. 154(b) by 197 days.

(21) Appl. No.: 13/218,655

(22) Filed: Aug. 26, 2011

(65) Prior Publication Data

US 2012/0049726 A1 Mar. 1, 2012

(30) Foreign Application Priority Data

Aug. 27, 2010 (KR) .......................... 10-2010-0083631

(51) Int. Cl.
*H01L 51/54* (2006.01)

(52) U.S. Cl.
USPC .............................. 313/504; 313/500; 313/503

(58) Field of Classification Search
USPC ............... 313/498–512, 582–587; 315/169.1, 315/169.3; 428/690–691, 917; 257/40, 72, 257/98–100, 642–643, 759; 427/66, 427/532–535, 539
See application file for complete search history.

(56) References Cited

U.S. PATENT DOCUMENTS

| | | | |
|---|---|---|---|
| 2005/0001542 A1* | 1/2005 | Kiguchi ......................... | 313/504 |
| 2005/0087740 A1 | 4/2005 | Matsumoto et al. | |
| 2006/0228580 A1* | 10/2006 | Jeong et al. .................... | 428/690 |
| 2007/0002084 A1* | 1/2007 | Kimura et al. ................ | 345/694 |
| 2008/0204366 A1 | 8/2008 | Kane et al. | |
| 2009/0103022 A1 | 4/2009 | Roh et al. | |
| 2009/0121983 A1* | 5/2009 | Sung et al. ...................... | 345/76 |
| 2009/0322215 A1* | 12/2009 | Sung et al. .................... | 313/504 |

FOREIGN PATENT DOCUMENTS

| | | |
|---|---|---|
| CN | 101267701 | 9/2008 |
| CN | 101984487 A | 3/2011 |
| EP | 2204862 A2 | 7/2010 |

(Continued)

OTHER PUBLICATIONS

Office Action issued in corresponding United Kingdom Application No. GB1114899.6, mailed Dec. 23, 2011.

(Continued)

*Primary Examiner* — Anh Mai
*Assistant Examiner* — Fatima Farokhrooz
(74) *Attorney, Agent, or Firm* — Brinks Gilson & Lione

(57) ABSTRACT

An organic electroluminescent device including a first red sub-pixel region, a first green sub-pixel region and a deep blue sub-pixel region in a first pixel region; and a second red sub-pixel region, a second green sub-pixel region and a sky blue sub-pixel region in a second pixel region adjacent to the first pixel region, wherein each of the first and second red sub-pixel regions includes a first electrode, a red organic emission material pattern and a second electrode, each of the first and second green sub-pixel regions includes the first electrode, a green organic emission material pattern and the second electrode, wherein the deep blue sub-pixel region includes the first electrode, a deep blue organic emission material pattern and the second electrode, and the sky blue sub-pixel region includes the first electrode, a sky blue organic emission material pattern and the second electrode, and wherein an unit pixel displaying an image includes at least one of the deep blue sub-pixel region and the sky blue sub-pixel region with the second red sub-pixel region and the second green sub-pixel region.

18 Claims, 10 Drawing Sheets

(56) References Cited

FOREIGN PATENT DOCUMENTS

| | | | |
|---|---|---|---|
| JP | 2007-018902 | | 1/2007 |
| JP | 2007-234961 | * | 1/2007 |
| KR | 1020100119653 A | | 11/2010 |
| KR | 1020110070176 A | | 6/2011 |
| WO | WO 2010/039938 A1 | | 4/2010 |
| WO | WO 2011/068761 A1 | | 6/2011 |

OTHER PUBLICATIONS

Office Action issued in corresponding United Kingdom Patent Application No. GB1114899.6, mailed Aug. 1, 2013, 3 pages.

Office Action issued in corresponding Chinese Patent Application No. 201110254519.9, mailed Oct. 31, 2013, 10 pages.

* cited by examiner

ORGANIC ELECTROLUMINESCENT DEVICE

The present application claims the benefit of Korean Patent Application No. 10-2010-0083631 filed in Korea on Aug. 27, 2010, which is herein incorporated by reference in its entirety.

BACKGROUND

1. Technical Field

The present disclosure relates to an organic electroluminescent device (OELD), and more particularly, to an OELD having advantages in an aperture ratio, color reproduction and resolution.

2. Related Art

Cathode ray tubes have been widely used as display devices. However, recently flat panel display devices, such as plasma display panel (PDP), a liquid crystal display (LCD) device and an OELD, are also being developed and used as display devices.

The OELD self-emits light type and therefore does not require a backlight unit. As a result, the OELD has low weight and low power consumption compared to other types of display devices. In addition, the OELD has excellent characteristics with respect to view angel, contrast ratio, response time and so on. Also, the OELD is fabricated by simpler processes and thus the OELD has a lower production cost. Recently, a flexible OELD has been introduced.

FIG. 1 is a band-diagram illustrating an emitting principle of the related art OELD.

As shown in FIG. 1, an organic electroluminescent diode 10 for the OELD includes an anode 21, a cathode 25, a hole transport layer (HTL) 33, an electron transport layer (ETL) 35, and an emission material layer (EML) 40. The HTL 33 and the ETL 35 are positioned between the anode 21 and the cathode 25, and the emission material layer is disposed between the HTL 33 and the ETL 35. In addition, to improve emission efficiency, the organic electroluminescent diode 10 further includes a hole injection layer (HIL) 37 between the anode 21 and the HTL 33 and an electron injection layer (EIL) 39 between the cathode 25 and the ETL 35.

When voltages are applied to the anode 21 and the cathode 25, a hole from the anode 21 and an electron from the cathode 25 are transported into the EML 40 creating an excitation. The excitation is transited from an excite state into a ground state and generates light. As a result, light is emitted from the EML 40.

Generally, the HIL 37, the HTL 33, the EML 40, the ETL 35 and the EIL 39 are formed by vacuum thermal deposition. In vacuum thermal deposition, a substrate is disposed over an organic material source in a vacuum chamber. The organic material source is heated such that an organic material is deposited onto the substrate. As a result, the above discussed elements are formed on the substrate. In vacuum thermal deposition, a shadow mask including a plurality of openings is disposed closely over the substrate, and the organic material is deposited through the openings.

Recently, the full-color OELD includes red, green and blue color emission material layers to provide full color images. In this case, to prevent a shadowing effect between adjacent emission material layers, there should be pre-determined spaces between adjacent emission material layers. The pre-determined spaces can not be used for emission and are referred to as dead zones.

It is preferable to reduce an area of the dead zones in order to achieve high resolution and high color reproduction. However, there is a technical limitation to reducing the area of the dead zones. Accordingly, to obtain high resolution and high color reproduction, the area of the emission material layer is reduced. Unfortunately, by reducing the area of the emission material layer, the aperture ratio of the OELD is reduced.

Recently, a quadruple type pixel has been introduced to improve the efficiency of the OELD. Improvement of an aperture ratio is also required in the quadruple type OELD.

SUMMARY

An organic electroluminescent device includes a first red sub-pixel region, a first green sub-pixel region and a deep blue sub-pixel region in a first pixel region; and a second red sub-pixel region, a second green sub-pixel region and a sky blue sub-pixel region in a second pixel region adjacent to the first pixel region, wherein each of the first and second red sub-pixel regions includes a first electrode, a red organic emission material pattern and a second electrode, each of the first and second green sub-pixel regions includes the first electrode, a green organic emission material pattern and the second electrode, wherein the deep blue sub-pixel region includes the first electrode, a deep blue organic emission material pattern and the second electrode, and the sky blue sub-pixel region includes the first electrode, a sky blue organic emission material pattern and the second electrode, and wherein an unit pixel displaying an image includes at least one of the deep blue sub-pixel region and the sky blue sub-pixel region with the second red sub-pixel region and the second green sub-pixel region.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION

Reference will now be made in detail to the exemplary embodiments, which are illustrated in the accompanying drawings.

Figure 1:
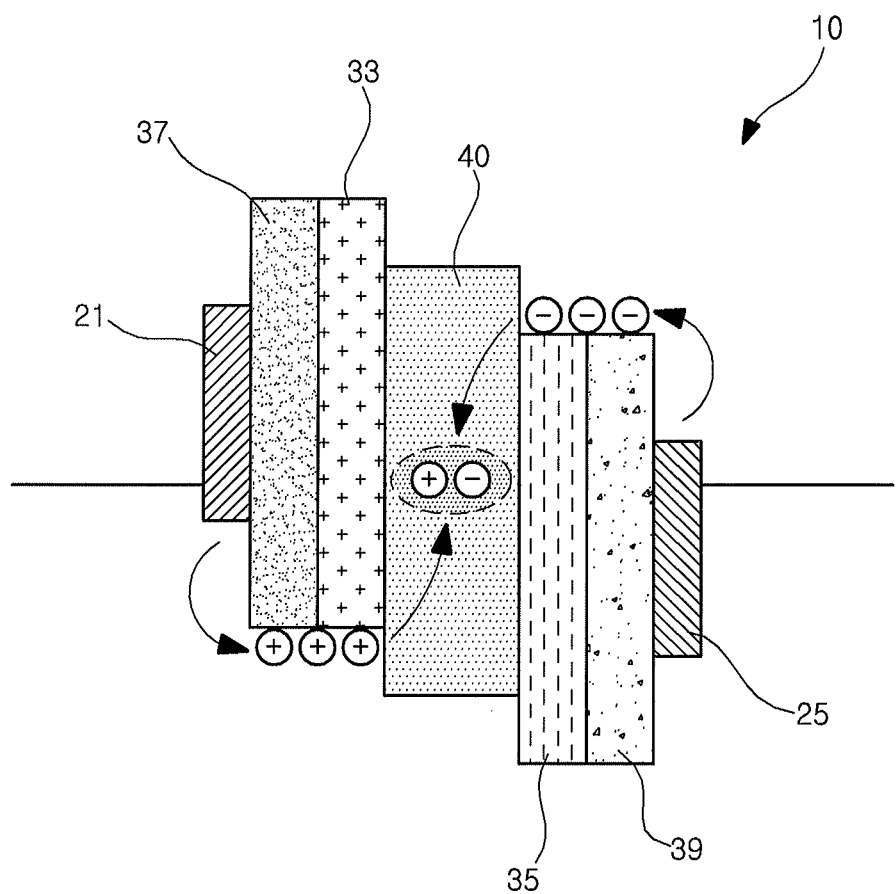
FIG. 1 is a band-diagram illustrating an emitting principle of the related art OELD.
Figure 2:
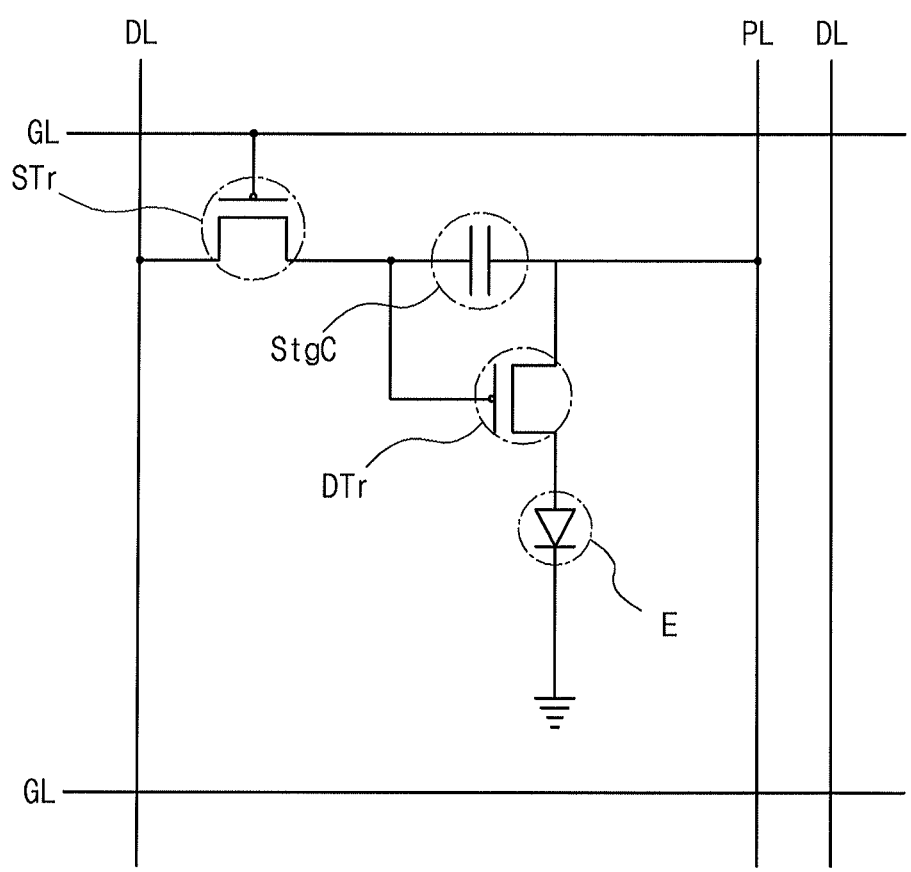
FIG. 2 is a circuit diagram showing an OELD according to an embodiment of the present invention.

FIG. 2 is a circuit diagram showing an OELD according to an embodiment of the present invention. As shown in FIG. 2, an OELD includes a gate line "GL", a data line "DL", a power supply line "PL", a switching thin film transistor (TFT) "STr", a storage capacitor "StgC", a driving TFT "DTr", and an organic electroluminescent diode "E". The gate line "GL" and the data line "DL" cross each other, and the power supply line "PL" is formed to be parallel to the data line "DL". The switching TFT "STr" is formed at crossing portion of the gate and data line "GL" and "DL". The driving TFT "DTr" is electrically connected to the switching TFT "STr".

The driving TFT "DTr" is electrically connected to the organic electroluminescent diode "E". In more detail, a first electrode of the organic electroluminescent diode "E" is connected to a drain electrode of the driving TFT "DTr. The power supply line "PL" provides a source voltage to the organic electroluminescent diode "E". The storage capacitor "StgC" is disposed between gate and source electrodes of the driving TFT "Tr".

When a signal is applied to the switching TFT "STr" through the gate line "GL" such that the switching TFT "STr" is turned on, a signal from the data line "DL" is applied to the gate electrode of the driving TFT "DTr" such that the driving TFT "DTr" is turned on. As a result, light is emitted from the organic electroluminescent diode "E". In this case, when the driving TFT "DTr" is turned on, the level of an electric current applied from the power supply line "PL" to the organic electroluminescent diode "E" is determined such that the organic electroluminescent diode "E" can produce a gray scale. The storage capacitor "StgC" serves to maintain the voltage of the gate electrode of the driving TFT "DTr" when the switching TFT "STr" is turned off. Accordingly, even if the switching TFT "STr" is turned off, the level of the electric current applied from the power supply line "PL" to the organic electroluminescent diode "E" is maintained to next frame.

Figure 3:
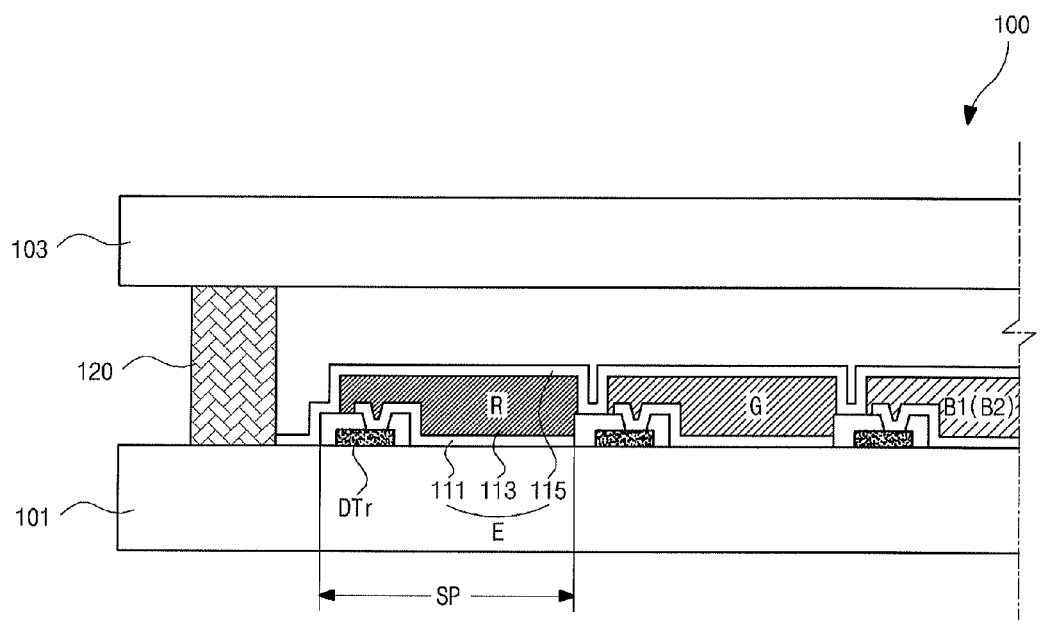
FIG. 3 is a schematic cross-sectional view of an OELD according to an embodiment of the present invention.

FIG. 3 is a schematic cross-sectional view of an OELD according to and embodiment of the present invention. The OELD is classified into a top emission type and a bottom emission type depending on a transporting direction of light from the organic emitting layer. Here, the OELD is explained with respect to a bottom emission type.

In FIG. 3, the OELD 100 includes a first substrate 101, a second substrate 103 and a seal pattern 120. The second substrate 103 faces the first substrate 101. The seal pattern 120 is disposed at the edges of the first and second substrates 101 and 103 to seal the space between the first and second substrates 101 and 103.

On the first substrate 101, a driving TFT "DTr" and a switching TFT (not shown) are formed in each sub-pixel region "SP". In addition, an organic electroluminescent diode "E" is formed over the first substrate 101 to be electrically connected to the driving TFT "DTr". The organic electroluminescent diode "E" includes a first electrode 111, which is connected to the driving TFT "DTr", an organic emission layer 113, which is disposed on the first electrode 111, and a second electrode 115, which is disposed on the organic emission layer 113. Although not shown, each of the driving TFTs "DTr" and the switching TFTs includes a gate electrode, a semiconductor layer, a source electrode and a drain electrode. For example, a driving TFT "DTr" may include the semiconductor layer of polycrystalline silicon as a top gate type. Alternatively, a driving TFT "DTr" may include a semiconductor layer of amorphous silicon and impurity-doped amorphous silicon as a bottom gate type.

For example, a top gate type driving TFT "DTr" includes the semiconductor layer of polycrystalline silicon, a gate insulating layer on the semiconductor layer, the gate electrode on the gate insulating layer, the source and drain electrodes over the gate electrode. The center of the semiconductor layer serves as a channel, and impurities are doped into both ends of the semiconductor layer. The source and drain electrodes contact both ends of the semiconductor layer.

The first electrode 111 of the organic electroluminescent diode "E" is electrically connected to the drain electrode of the driving TFT "DTr". The first electrode 111 serves as an anode, and the second electrode 115 serves as a cathode. The first electrode 111 is formed of a first material having a relatively high work function. For example, the first electrode 111 may be formed of a transparent conductive material, such as indium-tin-oxide (ITO) or indium-zinc-oxide (IZO). The second electrode 115 is formed of a second material having a relatively low work function and being opaque. For example, the second electrode 115 may be formed of one of an aluminum (Al), Al alloy, silver (Ag), magnesium (Mg), gold (Au) and Al—Mg alloy. The organic emission layer 113 includes first to third organic emission material patterns for respectively emitting red, green and blue colors. As a result, light emitted from the organic emission layer 113 passes through the first electrode 111.

The organic emission layer 113 includes not only the red and green organic emission material patterns but also a deep blue organic emission material pattern "B1" and a sky blue organic emission material pattern "B2". The deep blue organic emission material pattern "B1" has an advantage in color reproduction but has disadvantages with respect to lifetime and emission efficiency. In contrast, the sky blue organic emission material pattern "B2" has advantages in lifetime and emission efficiency but has a disadvantage in color reproduction. The OELD 100 may include both the deep blue organic emission material pattern "B1" and the sky blue organic emission material pattern "B2" in different pixel regions. In addition, a unit pixel can use the deep blue organic emission material pattern "B1" and the sky blue organic emission material pattern "B2". Accordingly, the OELD 100 in the present disclosure has advantages in all of color reproduction, lifetime and emission efficiency.

Figure 4:
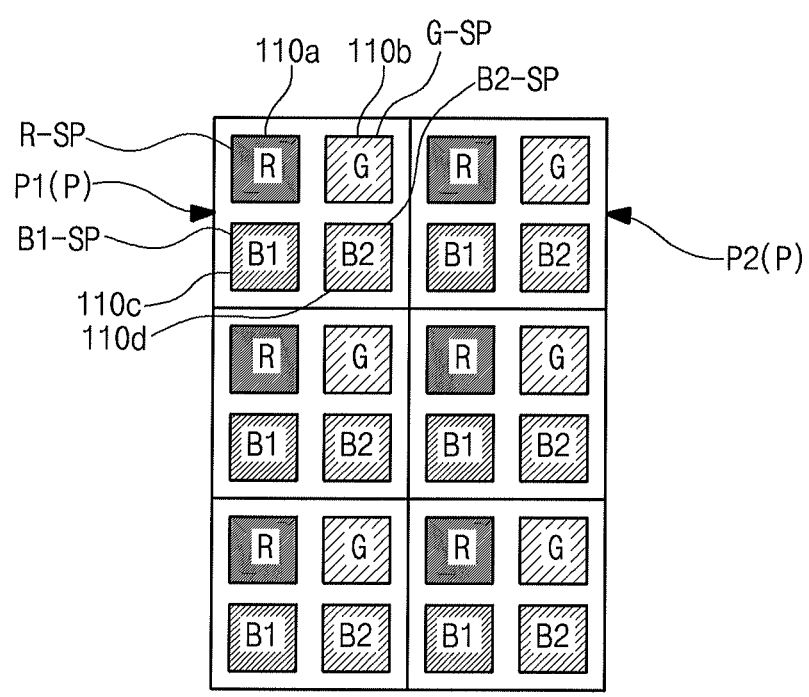
FIG. 4 is a schematic plan-view showing pixel arrangement of an OELD according to an embodiment of the present invention, respectively.

FIG. 4 is a schematic plan-view showing pixel arrangement of an OELD according to an embodiment of the present invention. In FIG. 4, four sub-pixel regions "R-SP", "G-SP", "B1-SP" and "B2-SP" are arranged in each of first and second pixel regions "P1" and "P2". Each pixel region "P" includes a red sub-pixel region "R-SP", a green sub-pixel region "G-SP", a deep blue sub-pixel region "B1-SP" and a sky blue sub-pixel region "B2-SP". Red, green, deep blue and sky blue organic emission material patterns 110a, 110b, 110c and 110d are respectively formed in the red sub-pixel region "R-SP", the green sub-pixel region "G-SP", the deep blue sub-pixel region "B1-SP" and the sky blue sub-pixel region "B2-SP". The sub-pixel regions "R-SP", "G-SP", "B1-SP" and "B2-SP" are arranged in a matrix.

Since each pixel region "P" of the OELD can display using both the deep blue organic emission material pattern 110c and the sky blue organic emission material pattern 110d, the OELD has advantages in all of color reproduction, lifetime and emission efficiency.

However, since a pre-determined space or distance is required adjacent sub-pixel regions "R-SP", "G-SP", "B1-SP" and "B2-SP", the effective emission area (i.e., an aperture ratio) is reduced.

To obtain advantages in all of color reproduction, lifetime, and emission efficiency and prevent a reduction of the effective emission area, another pixel arrangement is introduced.

Figure 5:
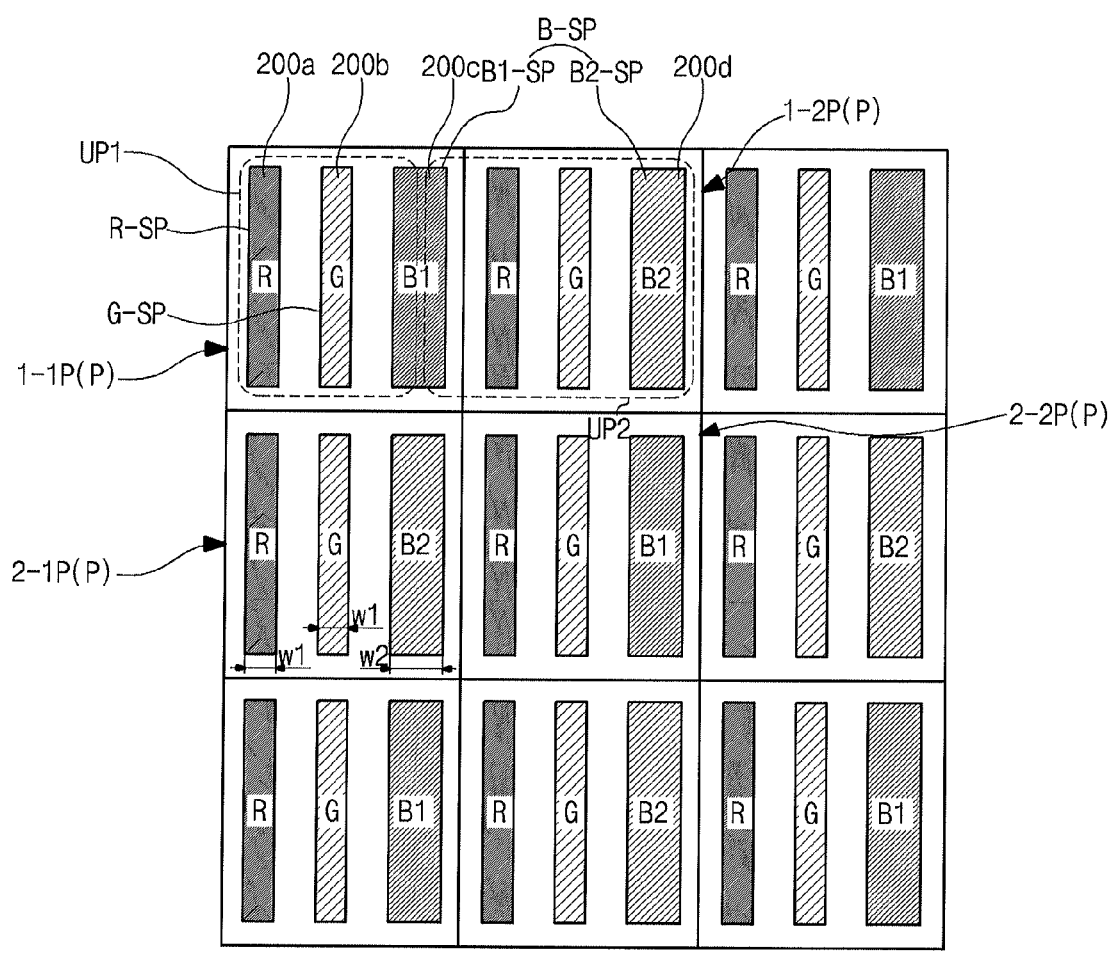
FIG. 5 is a schematic plan-view showing pixel arrangement of an OELD according to an embodiment of the present invention, respectively.

FIG. 5 is a schematic plan-view showing a pixel arrangement of an OELD according to an embodiment of the present invention. In FIG. 5, three sub-pixel regions are arranged in each pixel region "P". For example, a red sub-pixel region "R-SP", a green sub-pixel region "G-SP" and a deep blue sub-pixel region "B-SP" are arranged in a first pixel region "1-1P" in a first pixel row, and the red sub-pixel region "R-SP", the green sub-pixel region "G-SP" and a sky blue sub-pixel region "B2-SP" are arranged in a second pixel region "1-2P" in the first pixel row. The first and second pixel regions "P1" and "P2" are alternately arranged with each other. Namely, the red sub-pixel region "R-SP", the green sub-pixel region "G-SP", the deep blue sub-pixel region "B1-SP" and the sky blue sub-pixel region "B2-SP" are arranged in a stripe shape. In other words, the red sub-pixel region "R-SP", the green sub-pixel region "G-SP" and the deep blue sub-pixel region "B1-SP" are arranged in the first pixel region "1-1P" in the first pixel row along a first direction, and the red sub-pixel region "R-SP", the green sub-pixel region "G-SP" and the sky blue sub-pixel region "B2-SP" are arranged in the second pixel region "1-2P", which is adjacent to the first pixel region "1-1P" along the first direction, in the first pixel row. In addition, the red sub-pixel region "R-SP", the green sub-pixel region "G-SP" and the sky blue sub-pixel region "B2-SP" are arranged in the first pixel region "2-1P", which is adjacent to the first pixel region "1-1P" in the first pixel row along a second direction, in a second pixel row, and the red sub-pixel region "R-SP", the green sub-pixel region "G-SP" and the deep blue sub-pixel region "B1-SP" are arranged in the second pixel region "2-2P", which is adjacent to the first pixel region "2-1P" along the first direction, in the second pixel row. Namely, the first and second pixel regions "P1" and "P2" along the second direction are alternately arranged with each other.

Red, green, deep blue and sky blue organic emission material patterns 200a, 200b, 200c and 200d are respectively formed in the red sub-pixel region "R-SP", the green sub-pixel region "G-SP", the deep blue sub-pixel region "B1-SP" and the sky blue sub-pixel region "B2-SP". As discussed above, the deep blue organic emission material pattern 200c has an advantage in color reproduction but has disadvantages in lifetime and emission efficiency. In contrast, the sky blue organic emission material pattern 200d has advantages in lifetime and emission efficiency but has a disadvantage in color reproduction.

The deep blue organic emission material pattern 200c includes a blue color host and a deep blue color dopant. The deep blue color dopant has a weight % of about 2 to about 10 with respect to the blue color host. When the weight % of the deep blue color dopant is less than 2, the blue color emission is not sufficient. On the other hand, when the weight % of the deep blue color dopant is larger than 10, it is difficult to control the charge balance. The deep blue color dopant is preferably a material having an emission peak below about 460 nm. For example, the deep blue color dopant may be one of 4'-N,N-diphenylaminostyryl-triphenyl (DPA-TP), 2,5,2', 5'-tetrastyryl-biphenyl (TSM), and anthracene derivatives.

The sky blue organic emission material pattern 200d includes a blue color host and a sky blue color dopant. The sky blue color dopant has a weight % of about 2 to about 10 with respect to the blue color host. When the weight % of the deep blue color dopant is less than 2, blue color emission is not sufficient. On the other hand, when the weight % of the deep blue color dopant is larger than 10, sky blue color emission is too much such that color coordinate properties are degraded. The deep blue color dopant is preferably a material having an emission peak below about 470 nm. For example, the deep blue color dopant may be one of p-bis(p-N,N-diphenyl-aminostyryl)benzene (DSA-Ph) and phenylcyclopentadiene.

A first unit pixel "UP1" displays images using the deep blue organic emission material pattern 200c with the red and green organic emission material patterns 200a and 200b, and a second unit pixel "UP2" displays images using the sky blue organic emission material pattern 200d with the red and green organic emission material patterns 200a and 200b. Alternatively, the first unit pixel "UP1" displays images using the sky blue organic emission material pattern 200d with the red and green organic emission material patterns 200a and 200b, and the second unit pixel "UP2" displays images using the deep blue organic emission material pattern 200c with the red and green organic emission material patterns 200a and 200b. Alternatively, each of the first and second unit pixels "UP1" and "UP2" displays images using one of the deep blue organic emission material pattern 200c and the sky blue organic emission material pattern 200d with the red and green organic emission material patterns 200a and 200b.

Accordingly, to produce a high color reproduction image, each of the first and second unit pixels "UP1" and "UP2" uses the deep blue sub-pixel region "B1-SP". In contrast, to obtain long lifetime and high emission efficiency, each of the first and second unit pixels "UP1" and "UP2" uses the sky blue sub-pixel region "B2-SP".

With these pixel arrangements, each of the first and second unit pixels "UP1" and "UP2" displays images using one of the deep blue organic emission material pattern 200c and the sky blue organic emission material pattern 200d with the red and green organic emission material patterns 200a and 200b such that the OELD has advantages in all of the color reproduction, the lifetime and the emission efficiency.

Each of the red and green sub-pixel regions "R-SP" and "G-SP" has a first width "w1", and the deep blue sub-pixel region "B-SP" and the sky blue sub-pixel region "B2-SP" has a second width "w2" being larger than the first width "w1"; (w1<w2). For example, the second width "w2" may be two or three times of the first width "w1"; (2w1≤w2). Namely, the area of each of the deep blue sub-pixel region "B1-SP" and the sky blue sub-pixel region "B2-SP" is larger than that of the red and green sub-pixel regions "R-SP" and "G-SP". Accordingly, a sub-pixel rendering method is used for the adjacent unit pixels "UP1" and "UP2". In other words, the deep blue sub-pixel region "B1-SP" and the sky blue sub-pixel region "B2-SP" are shared in the adjacent unit pixels "UP1" and "UP2".

In more detail, as shown in FIG. 5, the first unit pixel "UP1" displays images using the deep blue sub-pixel region "B1-SP" in the first pixel region "1-1P" with the red and green sub-pixel regions "R-SP" and "G-SP" in the first pixel region "1-1P", and the second unit pixel "UP2" displays images using the deep blue sub-pixel region "B1-SP" in the first pixel region "1-1P" with the red and green sub-pixel regions "R-SP" and "G-SP" in the second pixel region "1-2P". Alternatively, the second unit pixel "UP2" displays images using the sky blue sub-pixel region "B2-SP" in the second pixel region "1-2P" with the red and green sub-pixel regions "R-SP" and "G-SP" in the second pixel region "1-2P". Namely, one unit pixel selectively uses either the deep blue sub-pixel region "B1-SP" or the sky blue sub-pixel region "B2-SP" by the rendering method.

In addition, since each of the deep blue and sky blue sub-pixel regions "B1-SP" and "B2-SP" has larger area than the red and green sub-pixel regions "R-SP" and "G-SP", the color balance among red, green and blue colors is not degraded by the rendering method. Furthermore, since three sub-pixel regions are arranged in each pixel region, the aperture ratio is increased with respect to a four sub-pixel arrangement structure.

Figure 6A:
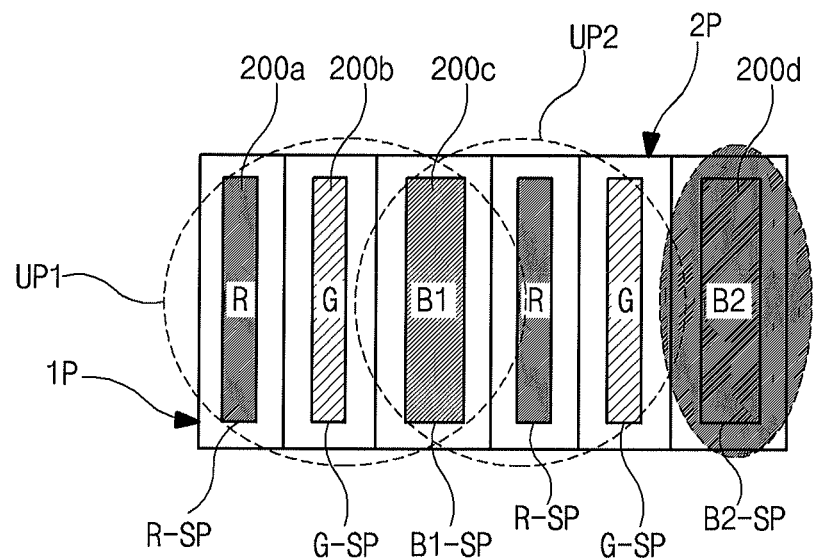
FIG. 6A and FIG. 6B are schematic plan-view illustrating an embodiment of a rendering method and a conventional method, respectively.
Figure 6B:
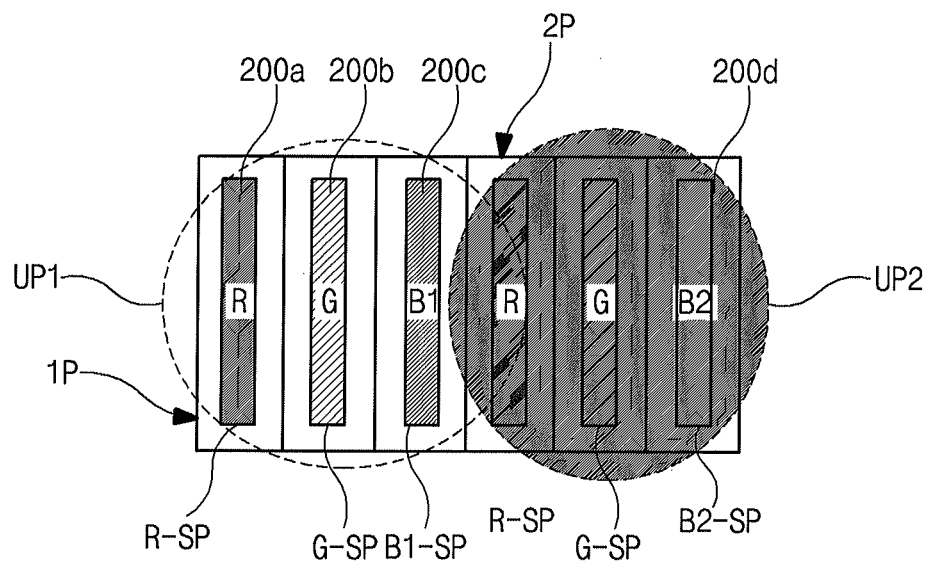

FIG. 6A and FIG. 6B are schematic plan-view illustrating a preferred embodiment of a rendering method and a conventional method, respectively.

To provide an image having clear color, both of the first and second unit pixels "UP1" and "UP2" use the deep blue sub-pixel region "B1-SP", as shown in FIG. 6A. Accordingly, only the sky blue sub-pixel region "B2-SP" in the second pixel region "1P" is not used.

In contrast, in the arrangement shown in FIG. 4B, only the first pixel unit "UP2" using the deep blue sub-pixel region "B1-SP" is used to provide an image having a clear color. In this case, all sub-pixels "R-SP", "G-SP" and "B2-SP" in the second pixel region "2P" are not used. In addition, even if the second unit pixel "UP2" display an image using the deep blue sub-pixel region "B1-SP" in the first pixel region "1P" with the red and green sub-pixel regions "R-SP" and "G-SP" in the second pixel region "2P", the color balance is degraded because the deep blue sub-pixel region "B1-SP" has the same area as the red and green sub-pixel regions "R-SP" and "G-SP".

Namely, when only one of the deep blue sub-pixel region "B1-SP" and the sky blue sub-pixel region "B2-SP" is driven, the number of sub-pixel regions not being driven is minimized. Accordingly, the aperture ratio is improved.

Figure 7:
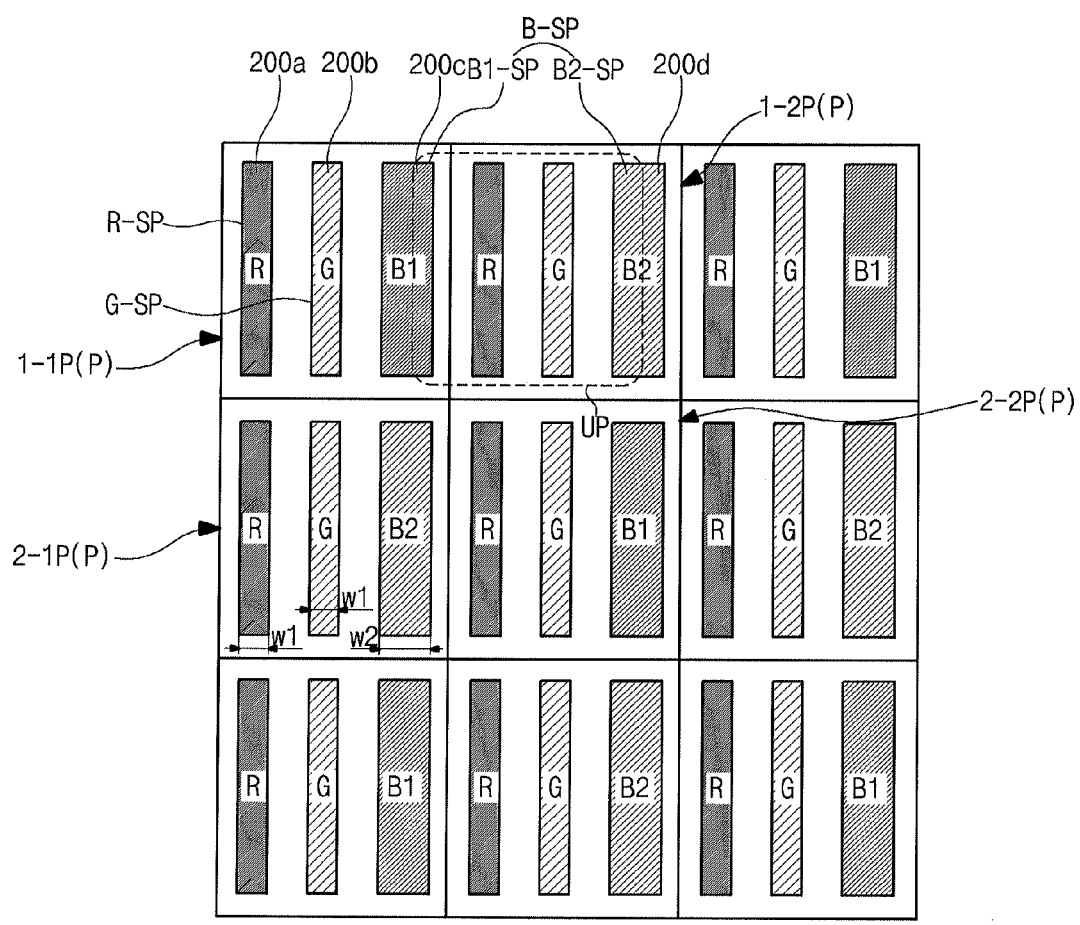
FIG. 7 is a schematic plan-view illustrating a rendering method in an OELD according to an embodiment of the present invention.

FIG. 7 is a schematic plan-view illustrating a rendering method in an OELD according to an embodiment of the present invention. Similar to FIG. 5, three sub-pixel regions are arranged in each pixel region "P". Namely, the red sub-pixel region "R-SP", the green sub-pixel region "G-SP" and the deep blue sub-pixel region "B1-SP" are arranged in the first pixel region "1-1P" in a first pixel row, and the red sub-pixel region "R-SP", the green sub-pixel region "G-SP" and the sky blue sub-pixel region "B2-SP" are arranged in the second pixel region "1-2P" in the first pixel row. In addition, each of the red and green sub-pixel regions "R-SP" and "G-SP" has a first width "w1", and the deep blue sub-pixel region "B1-SP" and the sky blue sub-pixel region "B2-SP" has a second width "w2" being larger than the first width "w1"; (w1<w2). That is, the area of each of the deep blue sub-pixel region "B1-SP" and the sky blue sub-pixel region "B2-SP" is larger than that of the red and green sub-pixel regions "R-SP" and "G-SP".

Each of the first and second unit pixels "UP1" and "UP2" displays images using at least one of the deep blue sub-pixel region "B1-SP" and the sky blue sub-pixel region "B2-SP" with the red and green sub-pixel regions "R-SP" and "G-SP". Since each unit pixel in the OELD uses both the deep blue sub-pixel region and sky blue sub-pixel region, the OELD has advantages in all of color reproduction, lifetime and emission efficiency.

Figure 8:
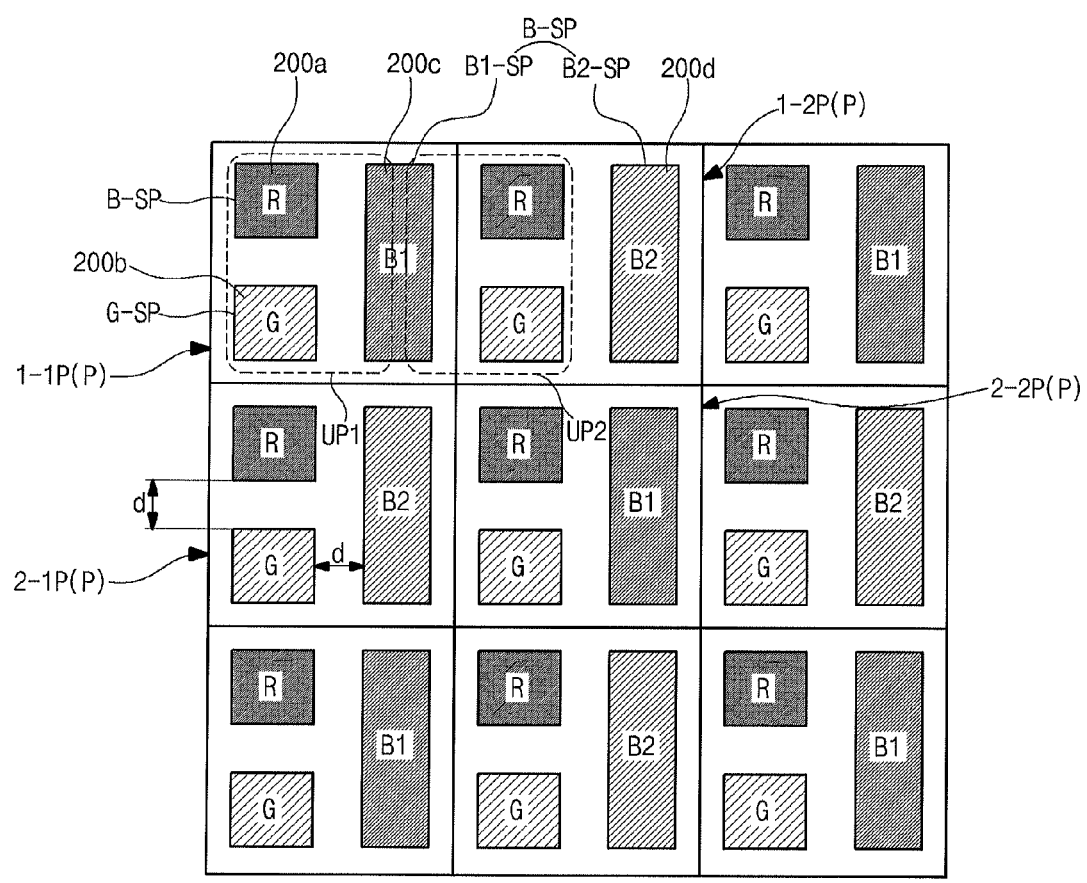
FIGS. 8 to 10 are schematic plan-views showing pixel arrangements of an OELD according to embodiments of the present invention.
Figure 9:
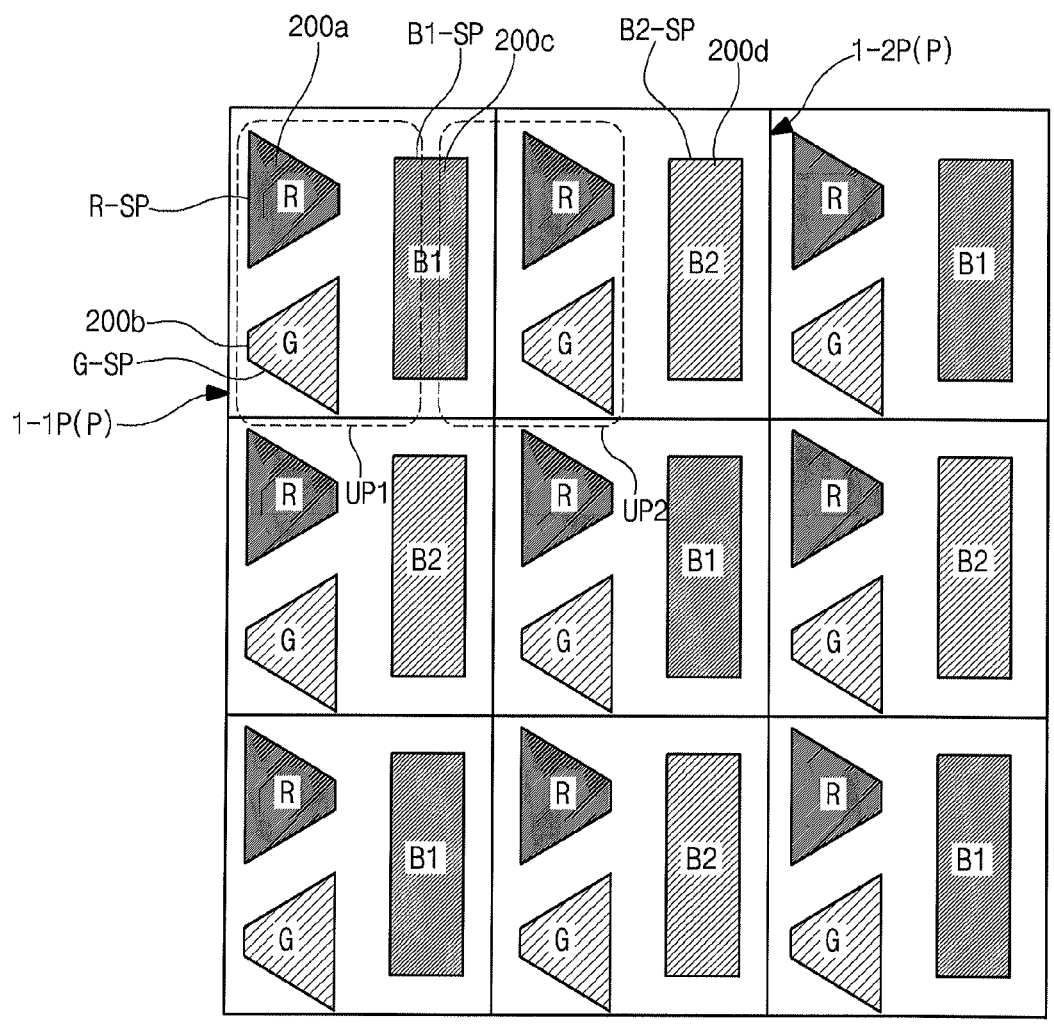
Figure 10:
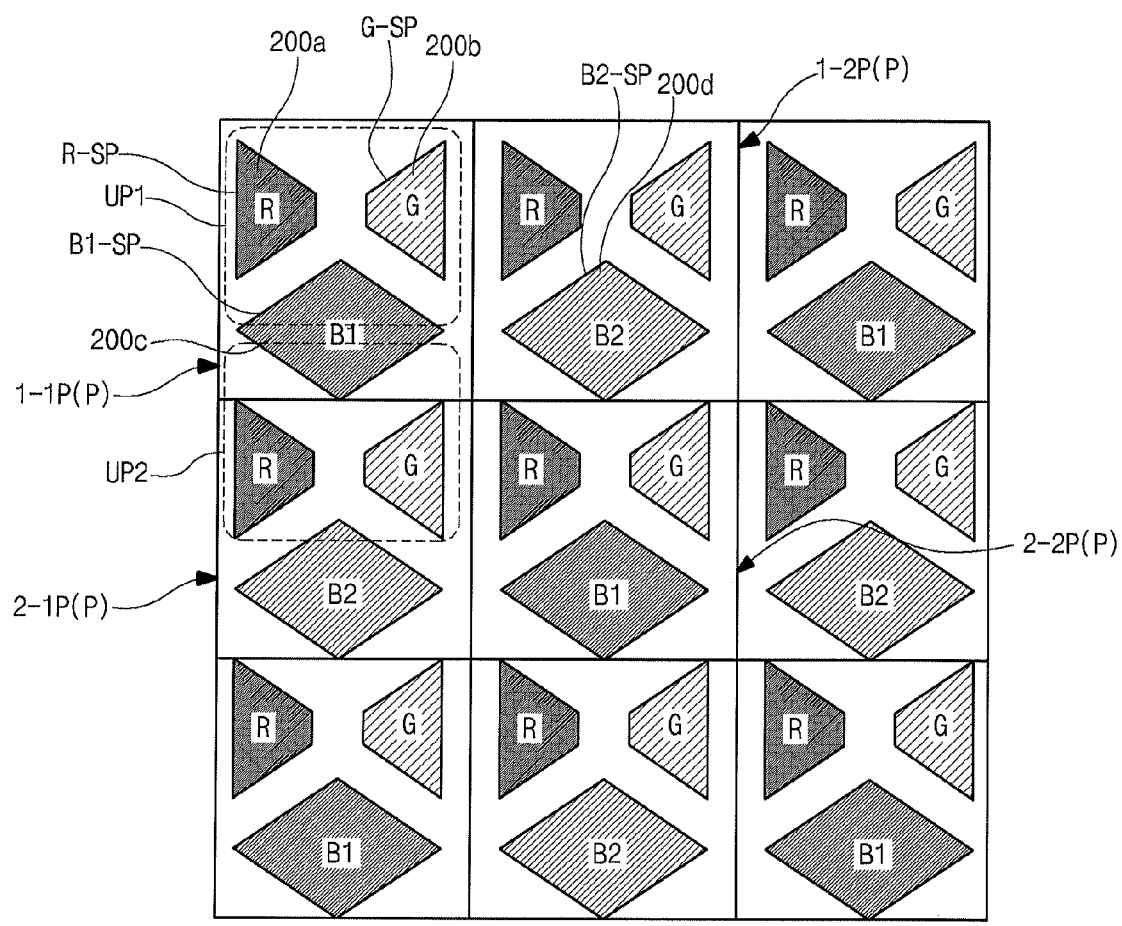

FIGS. 8 to 10 are a schematic plan-view showing three pixel arrangements of an OELD according to embodiments of the present invention.

In FIG. 8, three sub-pixel regions are arranged in each pixel region "P". Namely, the red sub-pixel region "R-SP", the green sub-pixel region "G-SP" and the deep blue sub-pixel region "B1-SP" are arranged in the first pixel region "1-1P" in a first pixel row, and the red sub-pixel region "R-SP", the green sub-pixel region "G-SP" and the sky blue sub-pixel region "B2-SP" are arranged in the second pixel region "1-2P" in the first pixel row. The first and second pixel regions "1-1P" and "1-2P" in the first pixel row are alternately arranged with each other.

In addition, the red sub-pixel region "R-SP", the green sub-pixel region "G-SP" and the sky blue sub-pixel region "B2-SP" are arranged in the first pixel region "2-1P" in a second pixel row, and the red sub-pixel region "R-SP", the green sub-pixel region "G-SP" and the deep blue sub-pixel region "B1-SP" are arranged in the second pixel region "2-2P" in the second pixel row. The first and second pixel regions "2-1P" and "2-2P" in the second pixel row are alternately arranged with each other.

In each pixel region "P", the red and green sub-pixel regions "R-SP" and "G-SP" are arranged along a vertical direction, and the deep blue and sky blue sub-pixel regions "B1-SP" and "B2-SP" are arranged along a horizontal direction with respect to the red and green sub-pixel regions "R-SP" and "G-SP". The red, green, deep blue and sky blue organic emission material patterns 200a, 200b, 200c and 200d are respectively formed in the red sub-pixel region "R-SP", the green sub-pixel region "G-SP", the deep blue sub-pixel region "B1-SP" and the sky blue sub-pixel region "B2-SP". Each of the red sub-pixel region "R-SP", the green sub-pixel region "G-SP", the deep blue sub-pixel region "B1-SP" and the sky blue sub-pixel region "B2-SP" has a tetragonal shape. In addition, a horizontal length, i.e., a width, of each of the deep blue and sky blue sub-pixel regions "B1-SP" and "B2-SP" is substantially the same as each of the red and green sub-pixel regions "R-SP" and "G-SP", while a vertical length of each of the deep blue and sky blue sub-pixel regions "B1-SP" and "B2-SP" is larger than that of each of the red and green sub-pixel regions "R-SP" and "G-SP". As a result, each of the deep blue and sky blue sub-pixel regions "B1-SP" and "B2-SP" has an area larger than each of the red and green sub-pixel regions "R-SP" and "G-SP".

As shown in FIG. 8, each of the first and second unit pixels "UP1" and "UP2" displays an image using one of the deep blue and sky blue sub-pixel regions "B1-SP" and "B2-SP" with the red and green sub-pixel regions "R-SP" and "G-SP". Accordingly, there are advantages in all of color reproduction, lifetime and emission efficiency. In addition, since each of the deep blue and sky blue sub-pixel regions "B1-SP" and "B2-SP" is larger than that of each of the red and green sub-pixel regions "R-SP" and "G-SP", the color balance is not degraded when a rendering method is used. Furthermore, the red and green organic emission material patterns 200a and 200b and the deep blue or sky blue organic emission material patterns 200c and 200d in each pixel regions "P" are spaced apart from each other by a pre-determined distance "d", a showing effect is prevented. Moreover, since there are three sub-pixel regions in each pixel region, even if the OELD includes fourth color organic emission material patterns, the aperture ratio is improved. Namely, the OELD has more pixel region "P" in unit area with compared to the related art OELD such that the OELD has a high resolution and high brightness.

As discussed above, each of the first and second unit pixels "UP1" and "UP2" may use both the deep blue sub-pixel region "B1-SP" and the sky blue sub-pixel region "B2-SP". Namely, each of the first and second unit pixels "UP1" and "UP2" uses at least one of the deep blue sub-pixel region "B1-SP" and the sky blue sub-pixel region "B2-SP" with the red and green sub-pixel regions "R-SP" and "G-SP".

As shown in FIG. 9, each of the red and green sub-pixel regions "R-SP" and "G-SP" has a trapezoidal shape. In each pixel region "P", the red and green sub-pixel regions "R-SP" and "G-SP" having a trapezoidal shape are symmetrically arranged. In each pixel region "P", a longer side of one of the red and green sub-pixel regions "R-SP" and "G-SP" is toward a left side, and a shorter side of the other one of the red and green sub-pixel regions "R-SP" and "G-SP" is toward a right side. For example, in the first pixel region "1-1P" of the first pixel row, a shorter side of the red sub-pixel region "R-SP"

faces the deep blue sub-pixel region "B1-SP", and a longer side of the green sub-pixel region "G-SP" faces the deep blue sub-pixel region "B1-SP".

The pixel arrangement in FIG. 9 is similar to that in FIG. 8. However, there is a difference in the shape of the red and green sub-pixel regions "R-SP" and "G-SP". Each of the red and green sub-pixel regions "R-SP" and "G-SP" may have a pentagonal shape, a hexagonal shape, and so on.

The sub-pixels are arranged in another shape. As shown in FIG. 10, in each pixel region "P" in the first pixel row, the red and green sub-pixel regions "R-SP" and "G-SP" are arranged along a horizontal direction and have a trapezoidal shape. A shorter side of the red sub-pixel region "R-SP" faces a shorter side of the green sub-pixel region "G-SP". The deep blue sub-pixel region "B1-SP" or the sky blue sub-pixel region "B2-SP" has a diamond shape and positioned at a vertical direction with respect to the red and green sub-pixel regions "R-SP" and "G-SP". In the first pixel row, the deep blue sub-pixel region "B1-SP" is positioned in the first pixel region "1-1P" and the sky blue sub-pixel region "B2-SP" is positioned in the second pixel region "1-2P". In the second pixel row, the sky blue sub-pixel region "B2-SP" is positioned in the first pixel region "2-1P", and the deep blue sub-pixel region "B1-SP" is positioned in the second pixel region "2-2P". The adjacent pixel regions along the vertical direction share the deep blue sub-pixel region "B1-SP" and the sky blue sub-pixel region "B2-SP".

In the pixel arrangement in FIGS. 8 to 10, each of the deep blue sub-pixel region "B1-SP" and the sky blue sub-pixel region "B2-SP" has an area larger than each of the red and green sub-pixel regions "R-SP" and "G-SP" such that the unit pixels are driven by a rendering method that maintains a color balance. In addition, each unit pixel displays an images uses at least one of the deep blue sub-pixel region "B1-SP" and the sky blue sub-pixel region "B2-SP" such that the OELD has advantages in all of color reproduction, lifetime and emission efficiency.

Furthermore, since three sub-pixels, which are spaced apart from each other by a pre-determined distance, are positioned in each pixel region and each unit pixel uses one or both of the deep blue sub-pixel region "B1-SP" and the sky blue sub-pixel region "B2-SP", the OELD has an improved aperture ratio. Moreover, since more sub-pixels are formed in a unit area, the OELD has a high resolution.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An organic electroluminescent device, comprising:
a plurality of first pixel regions, each including a first red sub-pixel region, a first green sub-pixel region and a deep blue sub-pixel region; and
a plurality of second pixel regions, each including a second red sub-pixel region, a second green sub-pixel region and a sky blue sub-pixel region,
wherein each of the plurality of first and second pixel regions includes three sub-pixel regions, the first red sub-pixel region being the same as the second red sub-pixel region, the first green sub-pixel region being the same as the second green sub-pixel region and wherein the plurality of first pixel regions and the plurality of second pixel regions are alternately arranged with each other.

2. The device according to claim 1, wherein each of the deep blue sub-pixel region and the sky blue sub-pixel region has an area lager than each of the red and green sub-pixel regions.

3. The device according to claim 1, wherein the first red sub-pixel region and the first green sub-pixel region are positioned at one side of the deep blue sub-pixel region, and the second red-sub-pixel region and the second green sub-pixel region are positioned at the other side of the deep blue sub-pixel region such that the second red-sub-pixel region and the second green sub-pixel region are positioned between the deep blue sub-pixel region and the sky blue sub-pixel region.

4. The device according to claim 3, wherein a first unit pixel using the first red sub-pixel region and the first green sub-pixel region and a second unit pixel using the second red sub-pixel region and the second green sub-pixel region share the deep blue sub-pixel region.

5. The device according to claim 1, wherein the second red sub-pixel region and the second green sub-pixel region are positioned at one side of the sky blue sub-pixel region and has the same distance with the sky blue sub-pixel region.

6. The device according to claim 5, wherein each of the second red sub-pixel region and the second green sub-pixel region has a trapezoidal shape.

7. The device according to claim 6, wherein a shorter side of the second red sub-pixel region and a longer side of the second green sub-pixel region face the sky blue sub-pixel region.

8. The device according claim 1, wherein the first red sub-pixel region and first green sub-pixel region are arranged along a first direction and the deep blue sub-pixel region is arranged along a second direction with respect to the first red sub-pixel region and first green sub-pixel region.

9. The device according to claim 8, wherein the deep blue sub-pixel region has a diamond shape, each of the first red sub-pixel region and the first green sub-pixel region has a trapezoidal shape, and wherein a shorter side of the first red sub-pixel region faces a shorter side of the first green sub-pixel region.

10. The device according to claim 1, wherein the deep blue organic emission material pattern includes a blue color host and a deep blue color dopant having an emission peak below about 460 nm.

11. The device according to claim 10, wherein the deep blue color dopant has a weight % of about 2 to about 10 with respect to a blue color host.

12. The device according to claim 1, wherein the sky blue organic emission material pattern includes a blue color host and a sky blue color dopant having an emission peak below about 470 nm.

13. The device according to claim 12, wherein the sky blue color dopant has a weight % of about 2 to about 10 with respect to a blue color host.

14. The device according to claim 1, wherein each of the first red sub-pixel region and the first green sub-pixel region has a longer side and a shorter side, the shorter side of one of the first red sub-pixel region and the first green sub-pixel region and the longer side of the other one of the first red sub-pixel region and the first green sub-pixel region face the deep blue sub-pixel region.

15. An organic electroluminescent device, comprising:
a plurality of first pixel regions, each of the first pixel regions having three sub-pixel regions of a first red sub-pixel region, a first green sub-pixel region and a deep blue sub-pixel region, an area of the deep blue sub-pixel region being greater than an area of the first red sub-pixel region and an area of the first green sub-pixel region;

a plurality of second pixel regions, each of the second pixel regions having three sub-pixel regions a second red sub-pixel region, a second green sub-pixel region and a sky blue sub-pixel, an area of the sky blue sub-pixel region being greater than an area of the second red sub-pixel region and an area of the second green sub-pixel region;

the first pixel regions and the second pixel regions being arranged in a matrix wherein the first and second pixel regions are alternately disposed such that the first and second pixel regions are adjacent to each other;

a plurality of first pixel units, each first pixel unit displaying an image, wherein each first pixel unit includes a first red sub-pixel region, a first green sub-pixel region and a first portion of a deep blue sub-pixel region and a first portion of an adjacent sky blue sub-pixel region;

a plurality of second pixel units, each second pixel unit displaying an image, wherein each second pixel unit includes a second red sub-pixel region, a second green sub-pixel region and a second portion of the deep blue sub-pixel region and a second portion of the adjacent sky blue sub-pixel region.

16. The device according to claim 15, wherein each first and second red sub-pixel regions and each first and second green sub-pixel regions has a stripe shape.

17. The device according to claim 15, wherein each second red sub-pixel region and each second green sub-pixel region has a trapezoidal shape.

18. The device according to claim 15, wherein the deep blue sub-pixel region has a diamond shape.

* * * * *